US012431936B2

(12) United States Patent
Ono et al.

(10) Patent No.: US 12,431,936 B2
(45) Date of Patent: Sep. 30, 2025

(54) RADIO FREQUENCY CIRCUIT AND RADIO FREQUENCY MODULE

(71) Applicant: Murata Manufacturing Co., Ltd., Nagaokakyo (JP)

(72) Inventors: Atsushi Ono, Nagaokakyo (JP); Satoshi Tanaka, Nagaokakyo (JP); Hirotsugu Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 323 days.

(21) Appl. No.: 18/337,499

(22) Filed: Jun. 20, 2023

(65) Prior Publication Data
US 2023/0336204 A1      Oct. 19, 2023

Related U.S. Application Data

(63) Continuation of application No. PCT/JP2021/046256, filed on Dec. 15, 2021.

(30) Foreign Application Priority Data

Dec. 21, 2020   (JP) ................. 2020-211517

(51) Int. Cl.
*H04B 1/40*   (2015.01)
*H03F 1/02*   (2006.01)
(Continued)

(52) U.S. Cl.
CPC .......... *H04B 1/40* (2013.01); *H03F 1/0205* (2013.01); *H03F 3/245* (2013.01); *H03F 3/68* (2013.01);
(Continued)

(58) Field of Classification Search
None
See application file for complete search history.

(56) References Cited

U.S. PATENT DOCUMENTS 9,660,687 B2 *   5/2017   Ellä ................... H04B 1/006
2004/0005867 A1   1/2004   Yu
(Continued)

FOREIGN PATENT DOCUMENTS

| JP | 2002-528946 A | 9/2002 |
| JP | 2004-147004 A | 5/2004 |
| JP | 2021-093709 A | 6/2021 |

OTHER PUBLICATIONS

International Search Report and Written Opinion mailed on Feb. 8, 2022, received for PCT Application PCT/JP2021/046256, filed on Dec. 15, 2021, 9 pages including English Translation.
(Continued)

*Primary Examiner* — Pablo N Tran
(74) *Attorney, Agent, or Firm* — XSENSUS LLP

(57) ABSTRACT

A radio frequency circuit includes a first radio frequency circuit, a second radio frequency circuit, and a first switch circuit. The first switch circuit includes a first terminal connected to an antenna connection terminal, a second terminal connected to the first radio frequency circuit, and a third terminal connected to the second radio frequency circuit. The first radio frequency circuit includes a first power amplifier circuit supporting a first power class, and a first filter circuit connected to the first power amplifier circuit and having a passband that includes a first band. The second radio frequency circuit includes a second power amplifier circuit supporting a second power class having a maximum output power greater than a maximum output power of the first power class. The second radio frequency circuit includes a second filter circuit connected to the second power amplifier circuit and having a passband that includes the first band.

20 Claims, 7 Drawing Sheets

(51) Int. Cl.
  *H03F 3/24*   (2006.01)
  *H03F 3/68*   (2006.01)
  *H04B 1/04*   (2006.01)

(52) U.S. Cl.
  CPC .. *H03F 2200/171* (2013.01); *H03F 2200/294* (2013.01); *H03F 2200/451* (2013.01); *H03F 2203/21157* (2013.01)

(56) References Cited

U.S. PATENT DOCUMENTS

| | | | |
|---|---|---|---|
| 2015/0133067 A1 | 5/2015 | Chang et al. | |
| 2016/0380652 A1* | 12/2016 | Anthony | H04B 1/0057 |
| | | | 375/295 |
| 2017/0026136 A1* | 1/2017 | Thompson | H04B 1/525 |
| 2018/0027563 A1* | 1/2018 | Nguyen | H04W 72/0473 |
| | | | 370/329 |
| 2021/0099199 A1* | 4/2021 | Pehlke | H04B 1/123 |
| 2023/0071403 A1* | 3/2023 | Mansour | H04B 1/50 |

OTHER PUBLICATIONS

Man Hung Ng (Nokia), "Email discussion summary for [96e][143] FS_LTE_NR_HPUE_FWVM", 3GPP TSG-RAN WG4 Meeting # 96-e-Bis, R4-2011880, Aug. 17-28, 2020, 10 pages.

Moderator (T-Mobile USA), "Email discussion summary for 96e[123] LTE_NR_B41_Bn41_PC29dBm", 3GPP TSG-RAN WG4 Meeting # 96-e, R4-2011863, Aug. 17-28, 2020, 7 pages.

\* cited by examiner

RADIO FREQUENCY CIRCUIT AND RADIO FREQUENCY MODULE

CROSS-REFERENCE TO RELATED APPLICATIONS

This is a continuation application of PCT International Application No. PCT/JP2021/046256 filed on Dec. 15, 2021, designating the United States of America, which is based on and claims priority to Japanese Patent Application No. 2020-211517 filed on Dec. 21, 2020. The entire disclosures of the above-identified applications, including the specifications, drawings, and claims are incorporated herein by reference in their entirety.

TECHNICAL FIELD

The present disclosure relates to a radio frequency (RF) circuit and a radio frequency module.

BACKGROUND

In mobile communication devices such as a mobile phone, the number of circuit components included in a radio frequency front end module is increasing, along with the development in multiband technology. For example, U.S. Patent Application Publication No. 2015/0133067 discloses a front end module in which power amplifiers, switches, and filters, for instance, are packaged.

The 3rd Generation Partnership Project (3GPP) has been discussing power classes (such as Power Classes 1, 1.5, and 2, for example) that allow maximum output power that is greater than that of a conventional class, mainly for a vehicle communication system or fixed wireless access (FWA).

SUMMARY

Technical Problems

As recognized by the present inventor, with the conventional technology, however, when a predetermined frequency band is used in a plurality of power classes, signal quality and/or power efficiency in one or more of the plurality of power classes may deteriorate.

In view of this, the present disclosure provides a radio frequency circuit and a radio frequency module that can reduce, when a plurality of power classes are used in a predetermined frequency band, deterioration of signal quality and power efficiency in the plurality of power classes.

Solutions

A radio frequency circuit according to an exemplary aspect of the present disclosure includes a first radio frequency circuit, a second radio frequency circuit, and a first switch circuit. The first switch circuit includes a first terminal connected to an antenna connection terminal, a second terminal connected to the first radio frequency circuit, and a third terminal connected to the second radio frequency circuit. The first radio frequency circuit includes a first power amplifier circuit supporting a first power class, and a first filter circuit connected to the first power amplifier circuit, and having a passband that includes a first band. The second radio frequency circuit includes a second power amplifier circuit supporting a second power class having a maximum output power greater than a maximum output power of the first power class. The second radio frequency circuit also includes a second filter circuit connected to the second power amplifier circuit, and having a passband that includes the first band.

Advantageous Effects

According to a radio frequency circuit according to the present disclosure, when a plurality of power classes are used in a predetermined frequency band, deterioration of signal quality and power efficiency in the plurality of power classes can be reduced.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
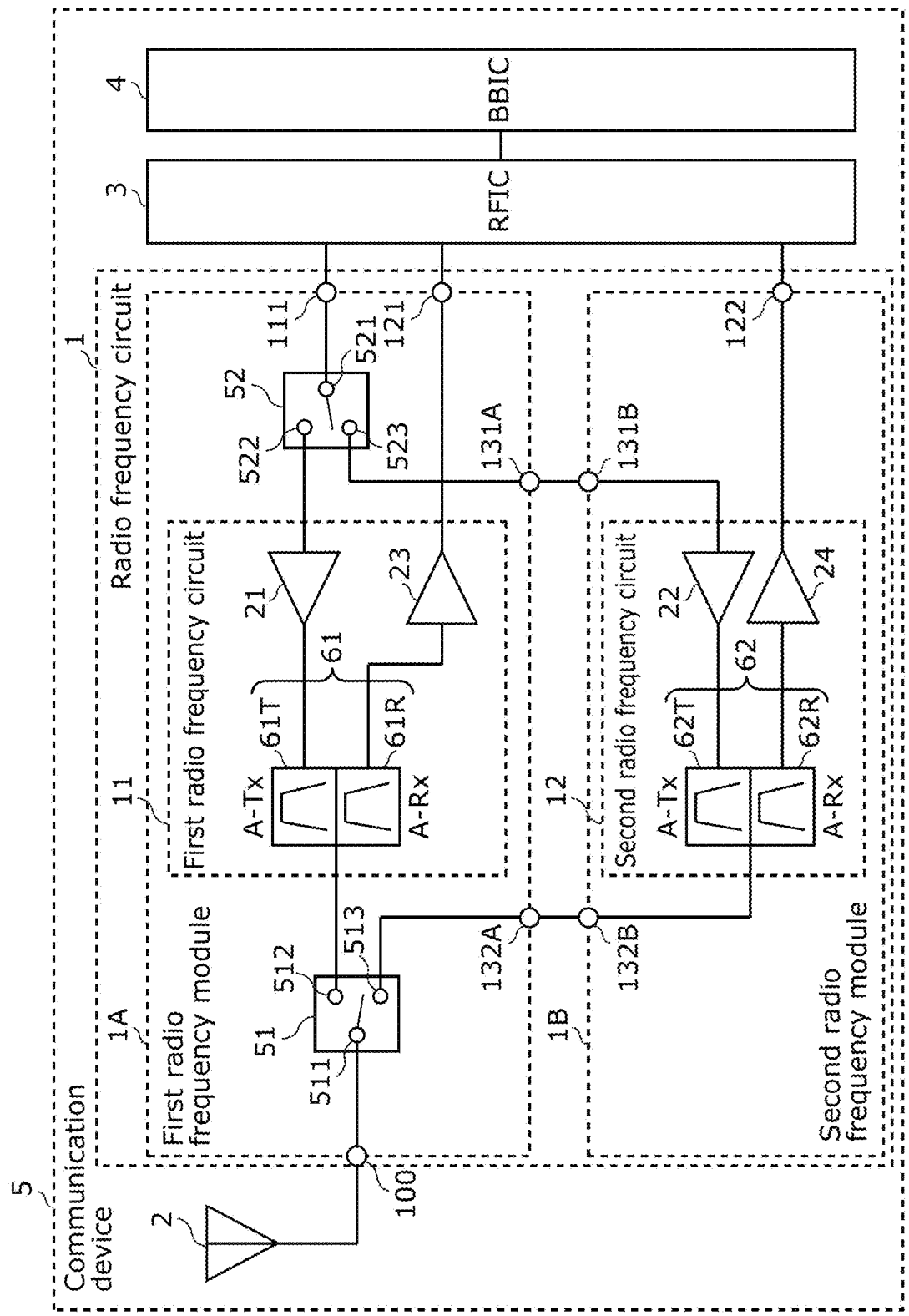
FIG. 1 illustrates a circuit configuration of a radio frequency circuit and a communication device according to an exemplary embodiment, Embodiment 1.

The following describes in detail exemplary embodiments of the present disclosure with reference to the drawings. Note that the embodiments described below each show a general or specific example. The numerical values, shapes, materials, elements, and the arrangement and connection of the elements, for instance, described in the following embodiments are examples, and thus are not intended to limit the present disclosure.

Note that the drawings are schematic diagrams to which emphasis, omission and ratio adjustment are appropriately added in order to illustrate the present disclosure, and thus are not necessarily accurate illustrations. The drawings may show shapes, positional relations, and ratios that are different from actual shapes, actual positional relations, and actual ratios. In the drawings, the same reference designator is given to substantially the same element, and redundant description may be omitted or simplified.

In the drawings described below, the x axis and the y axis are orthogonal to each other on a plane parallel to a principal surface of a module board. Specifically, when the module board has a quadrilateral shape in a plan view, the x axis is parallel to a first side of the module board, and the y axis is parallel to a second side of the module board orthogonal to the first side. The z axis is perpendicular to the principal surface of the module board, and the positive direction thereof represents an upward direction, whereas the negative direction thereof represents a downward direction.

In the circuit configuration of the present disclosure, "being connected" includes not only when being directly connected by a connection terminal and/or a line conductor, but also when being electrically connected via another circuit element. "Being directly connected" means being directly connected by a connection terminal and/or a line conductor without having another circuit element being provided therebetween. "Being connected between A and B" means being connected between A and B and to both of A and B, and also includes being connected between the ground and a path that connects A and B, in addition to being connected in series to the path.

In the arrangement of components of the present disclosure, "a component being disposed on a board" includes the component being disposed above the board without touching the board (for example, the component is stacked on another component disposed on the board) and the component being disposed in a state where the component is partially or entirely embedded in the board, in addition to the component being disposed on the board in contact with the board. Furthermore, "a component being disposed on a principal surface of a board" includes the component being disposed above the principal surface without touching the principal surface, and the component being disposed in a state where the component is partially embedded in the board from the principal surface side, in addition to the component being disposed on the principal surface of the board in contact with the principal surface.

Embodiment 1

[1.1 Circuit Configuration of Radio Frequency Circuit 1 and Communication Device 5]

A circuit configuration of radio frequency circuit 1 according to Embodiment 1 and communication device 5 that includes radio frequency circuit 1 is to be described with reference to FIG. 1. FIG. 1 illustrates a circuit configuration of radio frequency circuit 1 and communication device 5 according to Embodiment 1.

[1.1.1 Circuit Configuration of Communication Device 5]

First, a circuit configuration of communication device 5 is to be described. As illustrated in FIG. 1, communication device 5 according to the exemplary embodiment includes radio frequency circuit 1, antenna 2, radio frequency integrated circuit (RFIC) 3, and baseband integrated circuit (BBIC) 4.

Radio frequency circuit 1 transfers radio frequency signals between antenna 2 and RFIC 3. An internal configuration of radio frequency circuit 1 is to be described later.

Antenna 2 is connected to antenna connection terminal 100 of radio frequency circuit 1. Antenna 2 receives radio frequency signals from radio frequency circuit 1 and externally outputs the radio frequency signals. Antenna 2 receives external radio frequency signals and outputs the external radio frequency signals to radio frequency circuit 1.

RFIC 3 is an example of a signal processing circuit that processes radio frequency signals. Specifically, RFIC 3 processes a radio frequency reception signal input through a reception path of radio frequency circuit 1 by down-conversion, for instance, and outputs a reception signal generated by being processed to BBIC 4. RFIC 3 includes a controller that controls switch circuits and amplifier circuits, for instance, that are included in radio frequency circuit 1. Note that one or more or all of the functions of RFIC 3 as a controller may be provided outside of RFIC 3, and may be provided in BBIC 4 or radio frequency circuit 1, for example.

BBIC 4 is a base band signal processing circuit that processes signals using an intermediate frequency band lower than a frequency of a radio frequency signal transferred by radio frequency circuit 1. A signal processed by BBIC 4 is used, for example, as an image signal for image display or as an audio signal for talk through a loudspeaker.

Note that antenna 2 and BBIC 4 are not necessarily included in communication device 5 according to the exemplary embodiment.

[1.1.2 Circuit Configuration of Radio Frequency Circuit 1]

Next, a circuit configuration of radio frequency circuit 1 is to be described. As illustrated in FIG. 1, radio frequency circuit 1 includes first radio frequency circuit 11, second radio frequency circuit 12, switch circuits 51 and 52, antenna connection terminal 100, radio frequency input terminal 111, and radio frequency output terminals 121 and 122.

Antenna connection terminal 100 is connected to antenna 2 outside of radio frequency circuit 1.

Radio frequency input terminal 111 is an input terminal configured to receive external transmission signals in Band A from the outside of radio frequency circuit 1. In the exemplary embodiment, radio frequency input terminal 111 is connected to RFIC 3 outside of radio frequency circuit 1.

Radio frequency output terminals 121 and 122 are output terminals configured to supply reception signals in Band A to the outside of radio frequency circuit 1. In the exemplary embodiment, radio frequency output terminals 121 and 122 are connected to RFIC 3 outside of radio frequency circuit 1.

Switch circuit 51 is an example of a first switch circuit, and is connected between (i) antenna connection terminal 100 and (ii) first radio frequency circuit 11 and second radio frequency circuit 12. For example, a single-pole double-throw (SPDT) switch can be used as switch circuit 51, and may be referred to as an antenna switch.

Switch circuit 51 includes terminals 511 to 513. Terminal 511 is an example of a first terminal, and is connected to antenna connection terminal 100. Terminal 512 is an example of a second terminal, and is connected to first radio frequency circuit 11. Terminal 513 is an example of a third terminal, and is connected to second radio frequency circuit 12.

In this connection configuration, switch circuit 51 can connect terminal 511 to terminal 512 or 513, based on a control signal from RFIC 3, for example. Thus, switch circuit 51 can switch connection of antenna connection terminal 100 between first radio frequency circuit 11 and second radio frequency circuit 12. Specifically, when Band A is used in a first power class, switch circuit 51 connects terminal 511 to terminal 512, whereas when Band A is used in a second power class, switch circuit 51 connects terminal 511 to terminal 513.

Band A is an example of a first band, and is a frequency band for a communication system established using radio access technology (RAT) defined in advance by, for instance, a standardizing body (such as the 3GPP or the Institute of Electrical and Electronics Engineers (IEEE), for example). As a communication system, for example, a 5th Generation New Radio (5G NR) system, a Long Term Evolution (LTE) system, and a Wireless Local Area Network (WLAN) system, for instance, can be used, yet the communication system is not limited thereto.

As Band A, any of Band 41, Band 5, and Band 12 for LTE and n41 and n71 for 5G NR can be used, yet Band A is not limited thereto.

Switch circuit 52 is an example of a second switch circuit, and is connected between (i) radio frequency input terminal 111 and (ii) first radio frequency circuit 11 and second radio frequency circuit 12. For example, an SPDT switch can be used as switch circuit 52, and may be referred to as an RF in-switch.

Switch circuit 52 includes terminals 521 to 523. Terminal 521 is an example of a fourth terminal, and is connected to radio frequency input terminal 111. Terminal 522 is an example of a fifth terminal, and is connected to first radio frequency circuit 11. Terminal 523 is an example of a sixth terminal, and is connected to second radio frequency circuit 12.

In this connection configuration, switch circuit 52 can connect terminal 521 to terminal 522 or 523, based on a control signal from RFIC 3, for example. Thus, switch circuit 52 can switch connection of radio frequency input terminal 111 between first radio frequency circuit 11 and second radio frequency circuit 12. Specifically, when Band A is used in the first power class, switch circuit 52 connects terminal 521 to terminal 522, whereas when Band A is used in the second power class, switch circuit 52 connects terminal 521 to terminal 523.

First radio frequency circuit 11 is connected between (i) antenna connection terminal 100 and (ii) radio frequency input terminal 111 and radio frequency output terminal 121. First radio frequency circuit 11 includes power amplifier circuit 21, low-noise amplifier circuit 23, and duplexer circuit 61.

Power amplifier circuit 21 is an example of a first power amplifier circuit, and supports the first power class. Thus, power amplifier circuit 21 can amplify transmission signals in Band A to have power that satisfies the maximum output power of the first power class. The first power class includes Power Class 3, for example. The first power class may include Power Class 2. Power amplifier circuit 21 is connected between radio frequency input terminal 111 and transmission filter circuit 61T. Specifically, the input end of power amplifier circuit 21 is connected to radio frequency input terminal 111 via switch circuit 52, whereas the output end of power amplifier circuit 21 is connected to transmission filter circuit 61T.

Note that a power class is a classification of output power of user equipment defined based on, for instance, maximum output power, and a smaller value of a power class indicates that higher output power is allowed. For example, according to the 3GPP, the maximum output power of Power Class 1 is 31 dBm, the maximum output power of Power Class 1.5 is 29 dBm, and the maximum output power of Power Class 2 is 26 dBm, and the maximum output power of Power Class 3 is 23 dBm.

The maximum output power of user equipment is defined by the output power of an antenna end of the user equipment. The maximum output power of user equipment is measured using, for example, a method defined by the 3GPP, for instance. For example, in FIG. 1, the maximum output power is measured by measuring radiant power at antenna 2. Note that instead of measuring radiant power, a terminal is provided in the vicinity of antenna 2 and a measurement instrument (such as a spectrum analyzer, for example) is connected to the terminal, so that output power of antenna 2 can be measured.

A power class supported by a power amplifier circuit can be identified by the maximum output power of the power amplifier circuit. For example, the maximum output power of a power amplifier circuit that supports Power Class 1 is greater than 31 dBm. In general, the higher the maximum output power is, the greater the size of a power amplifier circuit is. Thus, a relative comparison between power classes supported by two power amplifier circuits can be often made by comparing the sizes of the two power amplifier circuits.

Low-noise amplifier circuit 23 can amplify reception signals in Band A. The input end of low-noise amplifier circuit 23 is connected to reception filter circuit 61R, and the output end of low-noise amplifier circuit 23 is connected to radio frequency output terminal 121.

Duplexer circuit 61 can pass radio frequency signals in Band A. Duplexer circuit 61 transfers transmission signals and reception signals in Band A by frequency division duplex (FDD). Duplexer circuit 61 includes transmission filter circuit 61T and reception filter circuit 61R.

Transmission filter circuit 61T (A-Tx) is an example of a first filter circuit, and has a passband that includes an uplink operation band in Band A. Transmission filter circuit 61T has power durability for the first power class. Accordingly, transmission filter circuit 61T can pass transmission signals in Band A, which have power that satisfies the maximum output power of the first power class.

Power durability of a filter can be obtained by measuring the maximum power of an input signal in the passband of the filter, with which an output signal that satisfies a predetermined condition can be obtained when the input signal is input to the filter.

Transmission filter circuit 61T is connected between power amplifier circuit 21 and antenna connection terminal 100. Specifically, the input end of transmission filter circuit 61T is connected to the output end of power amplifier circuit 21, whereas the output end of transmission filter circuit 61T is connected to antenna connection terminal 100 via switch circuit 51.

Reception filter circuit 61R (A-Rx) has a passband that includes a downlink operation band of Band A. Accordingly, reception filter circuit 61R can pass reception signals in Band A. Reception filter circuit 61R is connected between antenna connection terminal 100 and low-noise amplifier circuit 23. Specifically, the input end of reception filter circuit 61R is connected to antenna connection terminal 100 via switch circuit 51, whereas the output end of reception filter circuit 61R is connected to the input end of low-noise amplifier circuit 23.

Second radio frequency circuit 12 is connected between (i) antenna connection terminal 100 and (ii) radio frequency input terminal 111 and radio frequency output terminal 122. Second radio frequency circuit 12 includes power amplifier circuit 22, low-noise amplifier circuit 24, and duplexer circuit 62.

Power amplifier circuit 22 is an example of a second power amplifier circuit, and supports the second power class. Thus, power amplifier circuit 22 can amplify transmission signals in Band A to have power that satisfies the maximum output power of the second power class. The maximum output power of the second power class is greater than the maximum output power of the first power class. The second power class includes Power Class 1 and Power Class 1.5, for example. The second power class may include Power Class 2.

Power amplifier circuit 22 is connected between radio frequency input terminal 111 and transmission filter circuit 62T. Specifically, the input end of power amplifier circuit 22 is connected to radio frequency input terminal 111 via switch circuit 52, whereas the output end of power amplifier circuit 22 is connected to transmission filter circuit 62T.

Low-noise amplifier circuit 24 can amplify reception signals in Band A. The input end of low-noise amplifier circuit 24 is connected to reception filter circuit 62R, whereas the output end of low-noise amplifier circuit 24 is connected to radio frequency output terminal 122.

Duplexer circuit 62 can pass radio frequency signals in Band A. Duplexer circuit 62 transfers transmission signals and reception signals in Band A by FDD. Duplexer circuit 62 includes transmission filter circuit 62T and reception filter circuit 62R.

Transmission filter circuit 62T (A-Tx) is an example of a second filter circuit, and has a passband that includes an uplink operation band in Band A. Transmission filter circuit 62T has power durability for the second power class. Thus, transmission filter circuit 62T has higher power durability than that of transmission filter circuit 61T. Accordingly, transmission filter circuit 62T can pass transmission signals in Band A, which have power that satisfies the maximum output power of the second power class.

Transmission filter circuit 62T is connected between power amplifier circuit 22 and antenna connection terminal 100. Specifically, the input end of transmission filter circuit 62T is connected to the output end of power amplifier circuit 22, whereas the output end of transmission filter circuit 62T is connected to antenna connection terminal 100 via switch circuit 51.

Reception filter circuit 62R (A-Rx) has a passband that includes a downlink operation band in Band A. Accordingly, reception filter circuit 62R can pass reception signals in Band A. Reception filter circuit 62R is connected between antenna connection terminal 100 and low-noise amplifier circuit 24. Specifically, the input end of reception filter circuit 62R is connected to antenna connection terminal 100 via switch circuit 51, whereas the output end of reception filter circuit 62R is connected to the input end of low-noise amplifier circuit 24.

Radio frequency circuit 1 is separated and mounted on two modules (first radio frequency module 1A and second radio frequency module 1B). Specifically, switch circuits 51 and 52 and first radio frequency circuit 11 are mounted in first radio frequency module 1A, and second radio frequency circuit 12 is mounted in second radio frequency module 1B.

First radio frequency module 1A includes output terminal 131A connected to radio frequency input terminal 111 via switch circuit 52, and input-output terminal 132A connected to antenna connection terminal 100 via switch circuit 51. Second radio frequency module 1B includes input terminal 131B connected to the input end of power amplifier circuit 22, and input-output terminal 132B connected to duplexer circuit 62.

Output terminal 131A of first radio frequency module 1A is an output terminal configured to supply transmission signals in Band A to the outside of first radio frequency module 1A. Output terminal 131A is connected to input terminal 131B of second radio frequency module 1B.

Input terminal 131B of second radio frequency module 1B is an input terminal configured to receive external transmission signals in Band A from the outside of second radio frequency module 1B. Input terminal 131B is connected to output terminal 131A of first radio frequency module 1A.

Input-output terminal 132B of second radio frequency module 1B is an output terminal configured to supply transmission signals in Band A, to which the second power class is applicable, to the outside of second radio frequency module 1B, and furthermore is an input terminal configured to receive external reception signals in Band A from the outside of second radio frequency module 1B. Input-output terminal 132B is connected to input-output terminal 132A of first radio frequency module 1A.

Input-output terminal 132A of first radio frequency module 1A is an input terminal configured to receive external transmission signals in Band A, which have been amplified to have power that satisfies the maximum output power of the second power class, from the outside of first radio frequency module 1A, and furthermore is an output terminal configured to supply reception signals in Band A to the outside of first radio frequency module 1A. Input-output terminal 132A is connected to input-output terminal 132B of second radio frequency module 1B.

Note that one or more circuits out of the circuits shown in FIG. 1 may not be included in radio frequency circuit 1. For example, switch circuit 52 may not be included in radio frequency circuit 1. In this case, switch circuit 52 may be included in RFIC 3, and input terminal 131B of second radio frequency module 1B may be connected to RFIC 3. Low-noise amplifier circuit 23 and/or low-noise amplifier circuit 24 may not be included in radio frequency circuit 1, and reception filter circuit 61R and/or reception filter circuit 62R may not be included in radio frequency circuit 1.

[1.2 Arrangement of Components of Radio Frequency Modules]

Next, arrangement of components of first radio frequency module 1A and second radio frequency module 1B that are implementations of radio frequency circuit 1 having a configuration as above is to be described with reference to the drawings.

[1.2.1 Arrangement of Components of First Radio Frequency Module 1A]

First, an example of arrangement of components of first radio frequency module 1A is to be specifically described with reference to FIG. 2 and FIG. 3.

Figure 2:
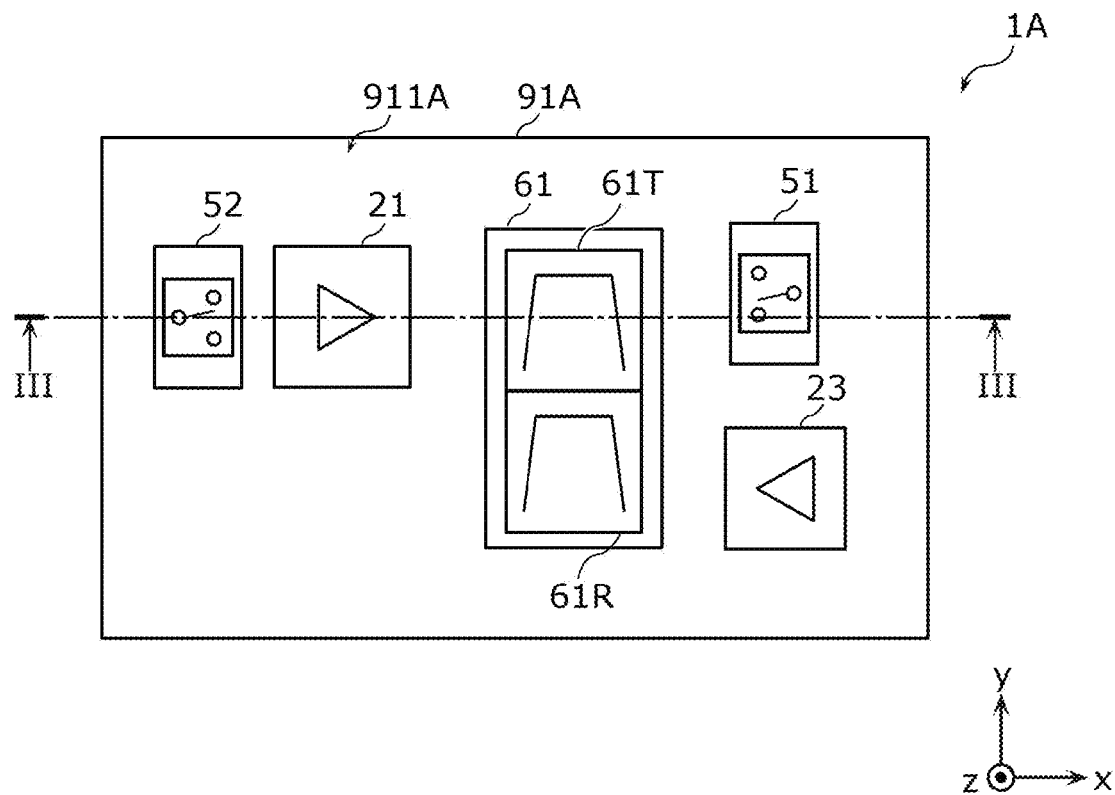
FIG. 2 is a plan view of a first radio frequency module according to Embodiment 1.
Figure 3:
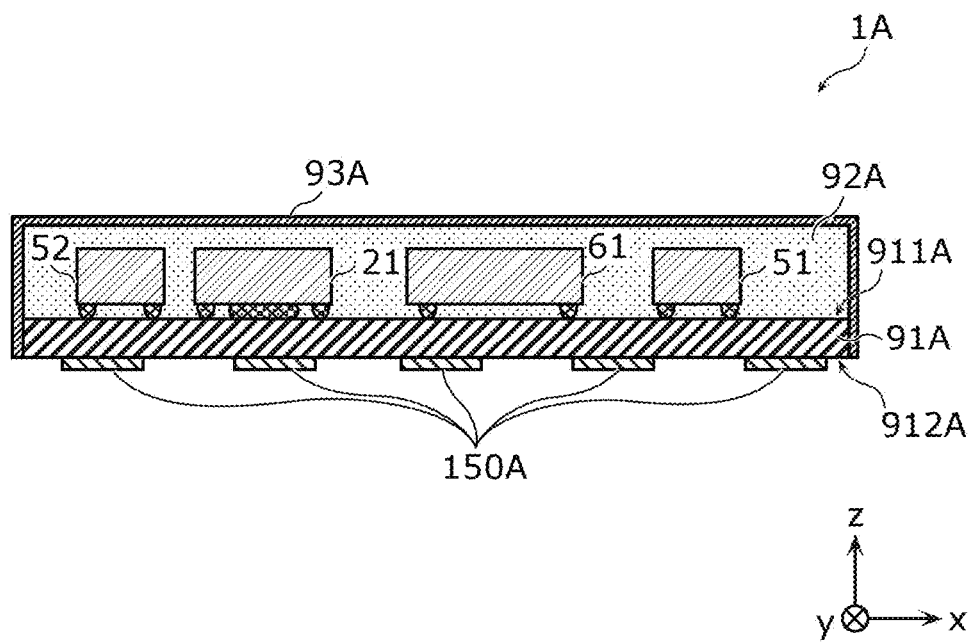
FIG. 3 is a cross sectional view of the first radio frequency module according to Embodiment 1.

FIG. 2 is a plan view of first radio frequency module 1A according to Embodiment 1. FIG. 3 is a cross sectional view of first radio frequency module 1A according to Embodiment 1. The cross section of first radio frequency module 1A in FIG. 3 is taken along line III-III in FIG. 2.

In addition to the circuits illustrated in FIG. 1, first radio frequency module 1A further includes module board 91A, resin member 92A, shield electrode layer 93A, and a plurality of external connection terminals 150A. Note that FIG. 2 omits illustration of resin member 92A and shield electrode layer 93A. Furthermore, FIG. 2 and FIG. 3 omit illustration of lines and electrodes that connect components disposed on module board 91A, except some electrodes.

Module board 91A includes principal surfaces 911A and 912A on opposite sides of module board 91A. In the exemplary embodiment, module board 91A is quadrilateral in a plan view, yet the shape of module board 91A is not limited thereto. As module board 91A, for example, one board can be used, out of a low temperature co-fired ceramics (LTCC) board, a high temperature co-fired ceramics (HTCC) board, a component-embedded board, a board that includes a redistribution layer (RDL), and a printed circuit board, each having a stacked structure of a plurality of dielectric layers, but module board 91A is not limited thereto.

Power amplifier circuit 21, low-noise amplifier circuit 23, switch circuits 51 and 52, and duplexer circuit 61 are disposed on principal surface 911A. Principal surface 911A and components on principal surface 911A are covered with resin member 92A.

Power amplifier circuit 21 includes a heterojunction bipolar transistor (HBT), for example. An HBT is manufactured using a semiconductor material. For example, silicon germanium (SiGe) or gallium arsenide (GaAs) can be used as the semiconductor material, yet the semiconductor material is not limited thereto.

Low-noise amplifier circuit 23 may include a complementary metal oxide semiconductor (CMOS), for example, and specifically, may be manufactured by a silicon on insulator (SOI) process. Accordingly, low-noise amplifier circuit 23 can be manufactured at low cost. Note that low-noise amplifier circuit 23 may include at least one of gallium arsenide (GaAs), silicon germanium (SiGe), or gallium nitride (GaN). Accordingly, high-quality low-noise amplifier circuit 23 can be produced.

Switch circuits 51 and 52 include a plurality of metal-oxide-semiconductor field-effect transistors (MOSFETs) connected in series, for example. The number of stages of MOSFETs connected in series may be determined according to necessary voltage durability, and is not limited in particular.

Duplexer circuit 61 may include any of, for example, a surface acoustic wave (SAW) filter, a bulk acoustic wave (BAW) filter, an inductor-capacitor (LC) resonator filter, and a dielectric resonator filter and furthermore, is not limited to such filters.

Resin member 92A covers principal surface 911A and components on principal surface 911A. Resin member 92A has a function of ensuring reliability of mechanical strength and moisture resistance, for instance, of components on principal surface 911A. Note that resin member 92A may not be included in first radio frequency module 1A.

Shield electrode layer 93A is a metal thin film formed by sputtering, for example, and is formed to cover top and side surfaces of resin member 92A and side surfaces of module board 91A. Shield electrode layer 93A is set to the ground potential, and prevents external noise from entering components included in first radio frequency module 1A.

External connection terminals 150A are disposed on principal surface 912A. External connection terminals 150A include a ground terminal, in addition to antenna connection terminal 100, radio frequency input terminal 111, radio frequency output terminal 121, output terminal 131A, and input-output terminal 132A illustrated in FIG. 1. External connection terminals 150A are joined to, for instance, an input-output terminal and/or a ground terminal on a mother board disposed in the z-axis negative direction of first radio frequency module 1A. As external connection terminals 150A, bump electrodes can be used, for example, yet external connection terminals 150A are not limited thereto.

[1.2.2 Arrangement of Components of Second Radio Frequency Module 1B]

Next, an example of arrangement of components of second radio frequency module 1B is to be specifically described with reference to FIG. 4 and FIG. 5.

Figure 4:
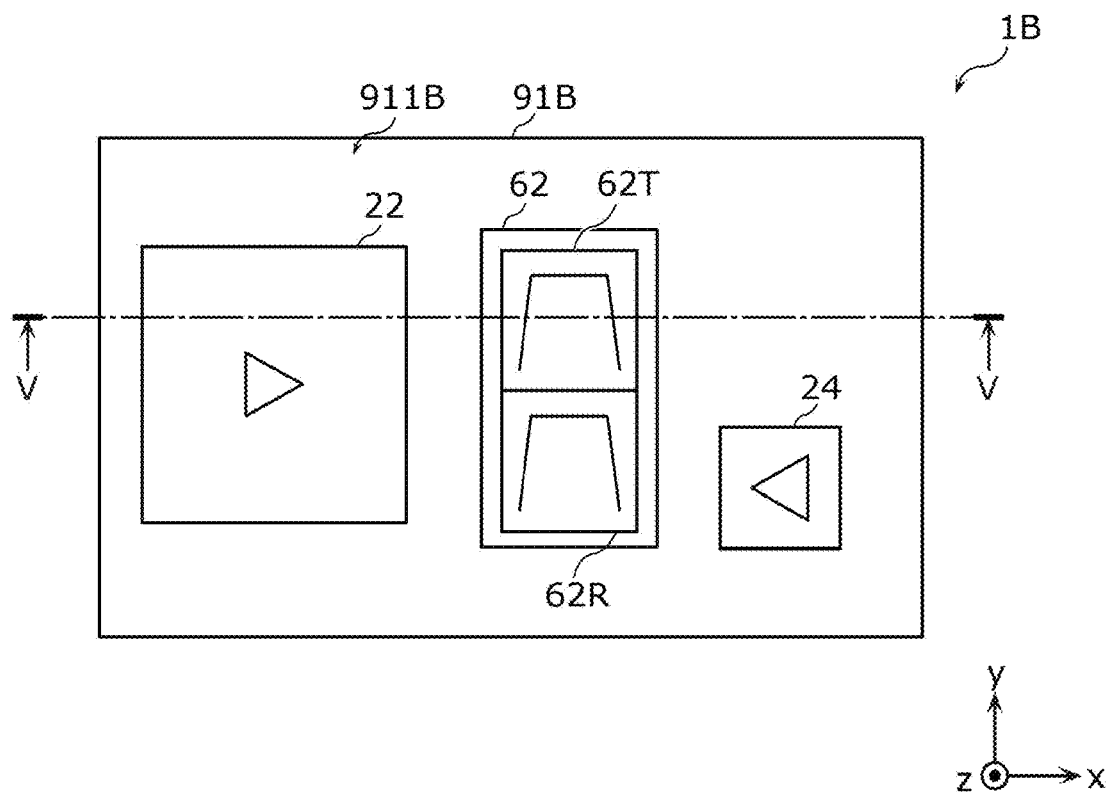
FIG. 4 is a plan view of a second radio frequency module according to Embodiment 1.
Figure 5:
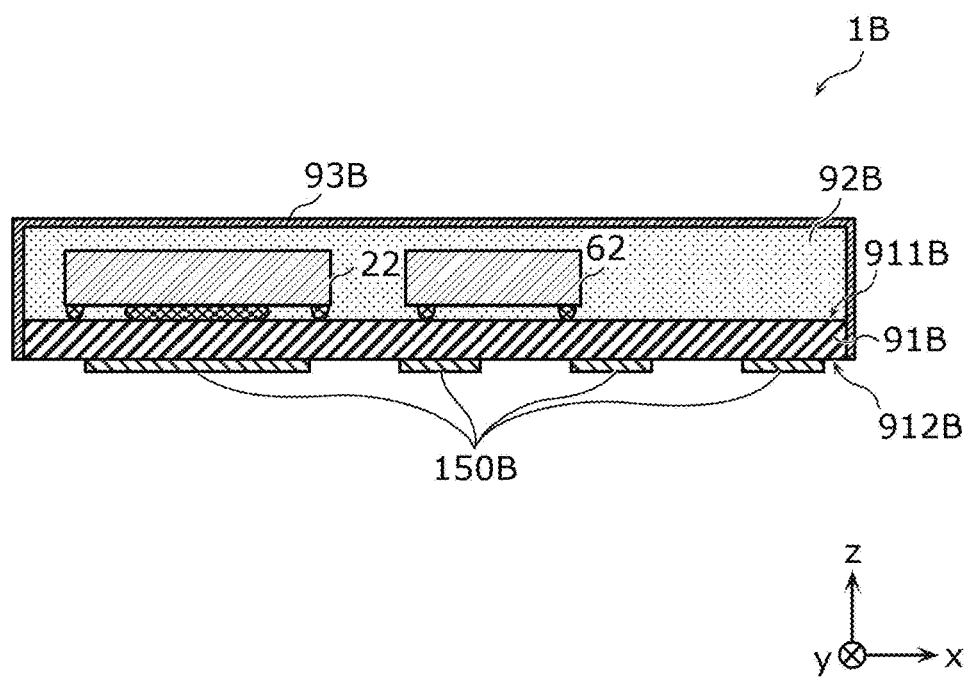
FIG. 5 is a cross sectional view of the second radio frequency module according to Embodiment 1.

FIG. 4 is a plan view of second radio frequency module 1B according to Embodiment 1. FIG. 5 is a cross sectional view of second radio frequency module 1B according to Embodiment 1. The cross section of second radio frequency module 1B in FIG. 5 is taken along line V-V in FIG. 4.

In addition to the circuits illustrated in FIG. 1, second radio frequency module 1B further includes module board 91B, resin member 92B, shield electrode layer 93B, and a plurality of external connection terminals 150B. Note that FIG. 4 omits illustration of resin member 92B and shield electrode layer 93B. Furthermore, FIG. 4 and FIG. 5 omit illustration of lines and electrodes that connect components disposed on module board 91B, except some electrodes.

Module board 91B includes principal surfaces 911B and 912B on opposite sides of module board 91B. In the exemplary embodiment, module board 91B is quadrilateral in a plan view, yet the shape of module board 91B is not limited thereto. As module board 91B, one board can be used, out of an LTCC board, an HTCC board, a component-embedded board, a board that includes an RDL, and a printed circuit board, but module board 91B is not limited thereto.

Power amplifier circuit 22, low-noise amplifier circuit 24, and duplexer circuit 62 are disposed on principal surface 911B. Principal surface 911B and components on principal surface 911B are covered with resin member 92B.

Power amplifier circuit 22 includes a high electron mobility transistor (HEMT), a metal-semiconductor field effect transistor (MESFET), or an HBT. An HEMT, an MESFET, and an HBT are manufactured using a semiconductor material. For example, gallium nitride (GaN) or silicon carbide (SIC) can be used as the semiconductor material, yet the semiconductor material is not limited thereto. Note that in the present embodiment, power amplifier circuit 22 has a size greater than the size of power amplifier circuit 21, and can achieve greater maximum output power.

Low-noise amplifier circuit 24 may include a CMOS, for example, and may be manufactured by the SOI process, specifically. Accordingly, low-noise amplifier circuit 24 can be manufactured at low cost. Note that low-noise amplifier circuit 24 may include at least one of gallium arsenide, silicon germanium, or gallium nitride. Accordingly, high-quality low-noise amplifier circuit 24 can be produced.

Duplexer circuit 62 may include any of a SAW filter, a BAW filter, an LC resonator filter, and a dielectric resonator filter and furthermore, the filter used is not limited thereto. Note that transmission filter circuit 62T may include a BAW filter or a dielectric resonator filter, in order to achieve higher power durability than that of transmission filter circuit 61T.

Resin member 92B covers principal surface 911B and components on principal surface 911B. Resin member 92B has a function of ensuring reliability of mechanical strength and moisture resistance, for instance, of components on principal surface 911B. Note that resin member 92B may not be included in second radio frequency module 1B.

Shield electrode layer 93B is a metal thin film formed by sputtering, for example, and is formed to cover top and side surfaces of resin member 92B and side surfaces of module board 91B. Shield electrode layer 93B is set to the ground potential, and prevents external noise from entering components included in second radio frequency module 1B.

External connection terminals 150B are disposed on principal surface 912B. External connection terminals 150B include a ground terminal, in addition to radio frequency output terminal 122, input terminal 131B, and input-output terminal 132B illustrated in FIG. 1. External connection terminals 150B are joined to, for instance, an input-output terminal and/or a ground terminal on a mother board disposed in the z-axis negative direction of second radio frequency module 1B. As external connection terminals 150B, bump electrodes can be used, for example, yet external connection terminals 150B are not limited thereto.

Note that the arrangement and shapes of the components illustrated in FIG. 2 to FIG. 5 are examples, and are not limited thereto. For example, one or more or all of the components included in first radio frequency module 1A may be disposed on principal surface 912A of module board 91A. In this case, principal surface 912A and components on principal surface 912A may be covered with a resin member.

[1.3 Advantageous Effects and Others]

As described above, a radio frequency circuit 1 according to the exemplary embodiment includes a first radio frequency circuit 11, a second radio frequency circuit 12, and a switch circuit 51. The switch circuit 51 includes a first terminal 511 connected to antenna connection terminal 100, a second terminal 512 connected to first radio frequency circuit 11, and a third terminal 513 connected to second radio frequency circuit 12. The first radio frequency circuit 11 includes a power amplifier circuit 21 that supports a first power class, and a transmission filter circuit 61T that is connected to power amplifier circuit 21 and that has a passband that includes Band A. The second radio frequency circuit 12 includes a power amplifier circuit 22 that supports a second power class with a maximum output power greater than a maximum output power of the first power class, and transmission filter circuit 62T that is connected to power amplifier circuit 22 and that has a passband that includes Band A.

According to this, the power amplifier circuit 21 that supports the first power class and the power amplifier circuit 22 that supports the second power class are included, and thus signals in Band A can be amplified using the power amplifier circuits 21 and 22 having characteristics suitable for the first power class and the second power class, respectively. Further, transmission filter circuit 61T is connected to power amplifier circuit 21 and transmission filter circuit 62T is connected to power amplifier circuit 22, and thus transmission filter circuits 61T and 62T having characteristics suitable for the first power class and the second power class, respectively, can be used. Thus, according to the power class applied to Band A, a combination of a power amplifier circuit and a transmission filter circuit having characteristics suitable for the power class can be used, so that deterioration of quality of signals and power efficiency in one of the first power class or the second power class or both of the power classes can be reduced.

In the radio frequency circuit 1 according to the exemplary embodiment, transmission filter circuit 62T may have power durability greater than power durability of transmission filter circuit 61T.

According to this, power durability of transmission filter circuit 62T through which a radio frequency signal in the second power class passes can be made higher than power durability of transmission filter circuit 61T through which a radio frequency signal in the first power class passes, and transmission filter circuits 61T and 62T having characteristics suitable for the first power class and the second power class, respectively, can be used.

In the radio frequency circuit 1 according to the exemplary embodiment, transmission filter circuit 61T may include a surface acoustic wave (SAW) filter, and transmission filter circuit 62T may include a bulk acoustic wave (BAW) filter or a dielectric resonator filter.

According to this, transmission filter circuit 62T includes a filter out of a BAW filter and a dielectric resonator filter that can achieve high power durability, and thus power durability of transmission filter circuit 62T can be increased. In contrast, transmission filter circuit 61T that is not required to have high power durability includes a SAW filter, and thus cost can be reduced.

In the radio frequency circuit 1 according to the exemplary embodiment, power amplifier circuit 21 may include a heterojunction bipolar transistor, and power amplifier circuit 22 may include a gallium nitride transistor or a silicon carbide transistor.

According to this, power amplifier circuit 22 that is required to have high output power includes a nitride gallium transistor, and thus power efficiency can be improved and the size can be reduced. Further, power amplifier circuit 21 that is not required to have high output power includes a heterojunction bipolar transistor, and thus cost can be reduced.

In the radio frequency circuit 1 according to the exemplary embodiment, switch circuit 51 may be configured to connect terminal 511 to terminal 512 under a condition that Band A is used in the first power class, and switch circuit 51 may be configured to connect terminal 511 to terminal 513 under a condition that Band A is used in the second power class.

According to this, a path of a transmission signal can be changed according to a power class applied to Band A. Thus, according to the power class applied to Band A, a combination of a power amplifier circuit and a transmission filter circuit having characteristics suitable for the power class can be selected, so that deterioration of quality of signals and power efficiency in one of the first power class or the second power class or both of the power classes can be reduced.

A radio frequency circuit 1 according to the exemplary embodiment may further include a switch circuit 52 that includes a terminal 521 connected to the radio frequency input terminal 111 to receive an external transmission signal in Band A, a terminal 522 connected to power amplifier circuit 21, and a terminal 523 connected to power amplifier circuit 22.

According to this, a transmission signal in Band A can be received through radio frequency input terminal 111, and the number of input-output terminals between radio frequency circuit 1 and RFIC 3 can be decreased.

In the radio frequency circuit 1 according to the exemplary embodiment, switch circuit 52 may be configured to connect terminal 521 to terminal 522 under a condition that Band A is used in the first power class, and switch circuit 52 may be configured to connect terminal 521 to terminal 523 under a condition that Band A is used in the second power class.

According to this, a path of a transmission signal can be changed according to a power class applied to Band A. Thus, according to the power class applied to Band A, a combination of a power amplifier circuit and a transmission filter circuit having characteristics suitable for the power class can be selected, so that deterioration of quality of signals and power efficiency in one of the first power class or the second power class or both of the power classes can be reduced.

In the radio frequency circuit 1 according to the exemplary embodiment, Band A may be one of Band 41 for Long Term Evolution (LTE), Band 5 for LTE, Band 12 for LTE, n41 for 5th Generation New Radio (5G NR), or n71 for 5G NR.

According to this, deterioration of signal quality and power efficiency can be reduced in Band 41, Band 5, and Band 12 for LTE and n41 and n71 for 5G NR for which adoption of Power Class 1 and/or Power Class 1.5 is being examined.

In the radio frequency circuit 1 according to the exemplary embodiment, the first power class may be Power Class 2 or 3, and the second power class may be Power Class 1 or 1.5.

According to this, a classification of power classes according to the 3GPP can be applied.

In the radio frequency circuit 1 according to the exemplary embodiment, first radio frequency circuit 11 may be mounted on module board 91A, and second radio frequency circuit 12 may be mounted on module board 91B.

According to this, first radio frequency circuit 11 and second radio frequency circuit 12 can be mounted on different boards. Thus, influence of heat, which is produced by power amplifier circuit 22 included in second radio frequency circuit 12, exerted on first radio frequency circuit 11 can be reduced, and deterioration of electrical characteristics of first radio frequency circuit 11 due to heat can be reduced. Since first radio frequency circuit 11 is separated, heat can be readily dissipated from second radio frequency circuit 12, and deterioration of electrical characteristics of second radio frequency circuit 12 can also be reduced.

In the radio frequency circuit 1 according to the exemplary embodiment, switch circuit 51 may be mounted on module board 91A.

According to this, switch circuit 51 can be mounted on a board different from the board on which second radio frequency circuit 12 is mounted, and deterioration of electrical characteristics of switch circuit 51 due to heat can be reduced.

The first radio frequency module 1A according to the present embodiment includes a module board 91A, a radio frequency input terminal 111 disposed on module board 91A to receive an external transmission signal in Band A, and a power amplifier circuit 21 disposed on module board 91A and connected to radio frequency input terminal 111. The power amplifier circuit 21 supports a first power class. A transmission filter circuit 61T disposed on module board 91A is connected to power amplifier circuit 21, and an input-output terminal 132A disposed on module board 91A receives an external transmission signal in Band A. The external transmission signal is amplified to have power that satisfies a maximum output power of a second power class that is greater than a maximum output power of the first class. A switch circuit 51 disposed on module board 91A includes a terminal 511 connected to an antenna connection terminal 100, a terminal 512 connected to the transmission filter circuit 61T, and a terminal 513 connected to the input-output terminal 132A.

According to this, the first radio frequency circuit 11 and the switch circuit 51 can be mounted as one module, and equivalent advantageous effects to those obtained by the radio frequency circuit 1 above can be yielded.

In the radio frequency circuit 1A according to the exemplary embodiment, switch circuit 51 may be configured to connect terminal 511 to terminal 512 under a condition that Band A is used in the first power class, and switch circuit 51 may be configured to connect terminal 511 to terminal 513 under a condition that Band A is used in the second power class.

According to this, a path of a transmission signal can be changed according to a power class applied to Band A. Thus, whether a transmission signal is amplified in first radio frequency module 1A or amplified outside of first radio frequency module 1A can be selected according to the power class applied to Band A, so that deterioration of quality of signals and power efficiency in one of the first power class or the second power class or both of the power classes can be reduced.

Embodiment 2

Next, Embodiment 2 is to be described. The exemplary embodiment is different from Embodiment 1 described above mainly in that signals in Band B in addition to Band A can be transmitted and received. The following gives description of the exemplary embodiment, focusing on differences from Embodiment 1 above, with reference to the drawings.

[2.1 Circuit Configuration of Radio Frequency Circuit 1C and Communication Device 5C]

Figure 6:
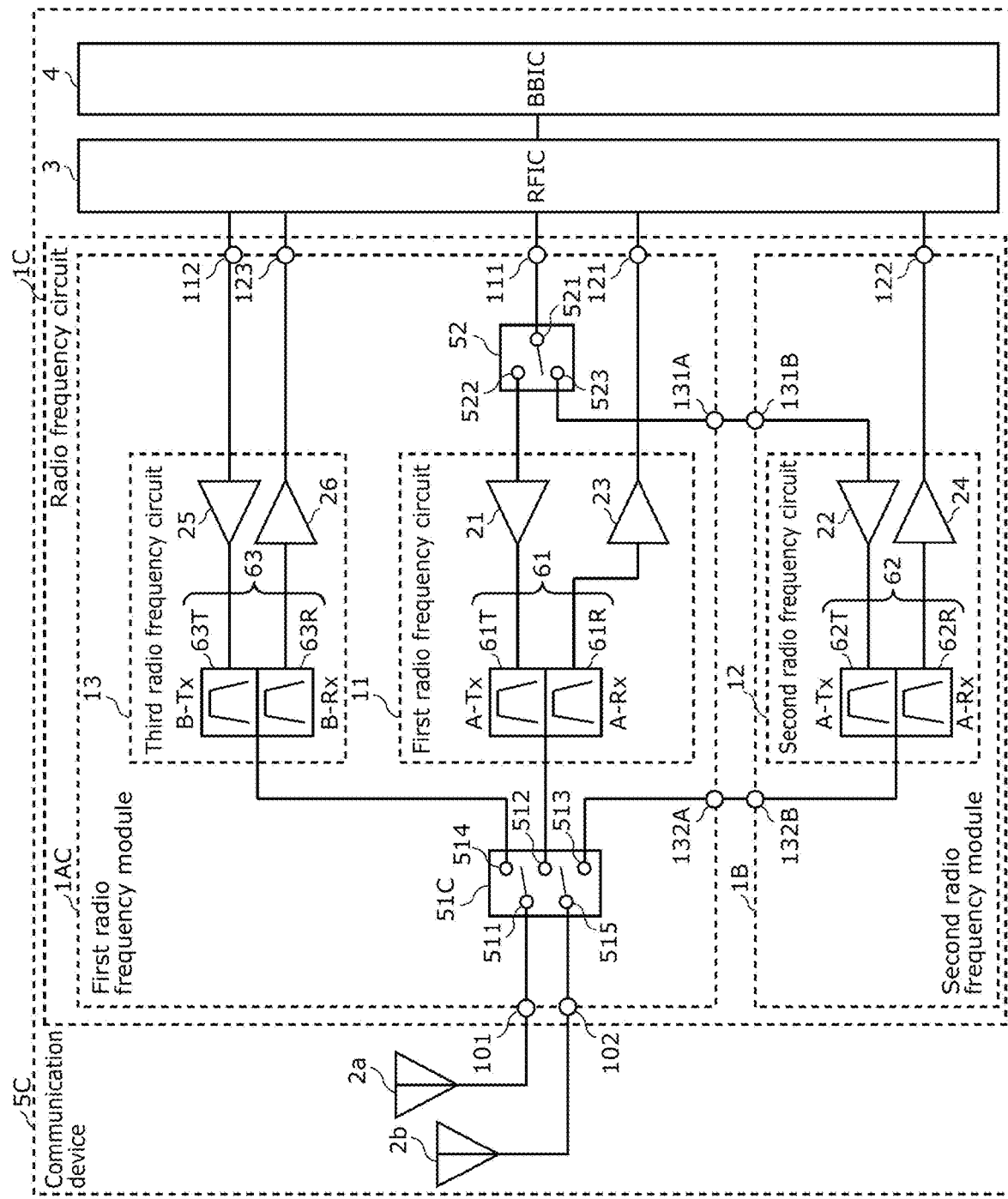
FIG. 6 illustrates a circuit configuration of a radio frequency circuit and a communication device according to another exemplary embodiment, Embodiment 2.

A circuit configuration of radio frequency circuit 1C and communication device 5C according to the exemplary embodiment is to be described with reference to FIG. 6. FIG. 6 illustrates a circuit configuration of radio frequency circuit 1C and communication device 5C according to Embodiment 2.

[2.1.1 Circuit Configuration of Communication Device 5C]

Communication device 5C according to the exemplary embodiment includes radio frequency circuit 1C, antennas 2a and 2b, RFIC 3, and BBIC 4, as illustrated in FIG. 6.

Antennas 2a and 2b are connected to antenna connection terminals 101 and 102 of radio frequency circuit 1C, respectively. Antennas 2a and 2b each receive a radio frequency signal from radio frequency circuit 1C and externally outputs the radio frequency signal. Antennas 2a and 2b each receive an external radio frequency signal and output the radio frequency signal to radio frequency circuit 1C.

[2.1.2 Circuit Configuration of Radio Frequency Circuit 1C]

Next, a circuit configuration of radio frequency circuit 1C is to be described. As illustrated in FIG. 6, radio frequency circuit 1C includes first radio frequency circuit 11, second radio frequency circuit 12, third radio frequency circuit 13, switch circuits 51C and 52, antenna connection terminals 101 and 102, radio frequency input terminals 111 and 112, and radio frequency output terminals 121 to 123.

Switch circuit 51C is an example of a first switch circuit, and is connected between (i) antenna connection terminals 101 and 102 and (ii) first radio frequency circuit 11, second radio frequency circuit 12, and third radio frequency circuit 13. Switch circuit 51C includes a multiple connection switch, for example, and may be referred to as an antenna switch.

Switch circuit 51C includes terminals 514 and 515, in addition to terminals 511 to 513. Terminal 514 is an example of a seventh terminal, and is connected to third radio frequency circuit 13. Terminals 511 and 515 are connected to antenna connection terminals 101 and 102, respectively.

In this connection configuration, switch circuit 51C can connect terminals 511 and 515 to terminals 512 to 514, based on a control signal from RFIC 3, for example. Thus, switch circuit 51C can connect first radio frequency circuit 11, second radio frequency circuit 12, and third radio frequency circuit 13 to antenna connection terminals 101 and 102. Specifically, when Band A is used in a first power class, switch circuit 51C connects terminal 511 or 515 to terminal 512, whereas when Band A is used in a second power class, switch circuit 51C connects terminal 511 or 515 to terminal 513. Further, when Band B is used, switch circuit 51C connects terminal 511 or 515 to terminal 514. Note that Bands A and B may be used simultaneously.

Third radio frequency circuit 13 is connected between (i) antenna connection terminals 101 and 102 and (ii) radio frequency input terminal 112 and radio frequency output terminal 123. Third radio frequency circuit 13 includes power amplifier circuit 25, low-noise amplifier circuit 26, and duplexer circuit 63.

Power amplifier circuit 25 is an example of a third power amplifier circuit, and supports the first power class. Thus, power amplifier circuit 25 can amplify transmission signals in Band B to have power that satisfies the maximum output power of the first power class. Power amplifier circuit 25 is connected between radio frequency input terminal 112 and transmission filter circuit 63T. Specifically, the input end of power amplifier circuit 25 is connected to radio frequency input terminal 112, whereas the output end of power amplifier circuit 25 is connected to transmission filter circuit 63T.

Low-noise amplifier circuit 26 can amplify reception signals in Band B. The input end of low-noise amplifier circuit 26 is connected to reception filter circuit 63R, and the output end of low-noise amplifier circuit 26 is connected to radio frequency output terminal 123.

Duplexer circuit 63 can pass radio frequency signals in Band B. Duplexer circuit 63 transfers transmission signals and reception signals in Band B by FDD. Duplexer circuit 63 includes transmission filter circuit 63T and reception filter circuit 63R.

As Band A, n41 for 5G NR can be used. As Band B, any of Band 2, Band 66, Band 12, and Band 25 for LTE can be used. In this case, signals in Bands A and B can be transmitted simultaneously.

Transmission filter circuit 63T (B-Tx) is an example of a third filter circuit, and has a passband that includes an uplink operation band in Band B. Accordingly, transmission filter circuit 63T can pass transmission signals in Band B. Transmission filter circuit 63T is connected between power amplifier circuit 25 and antenna connection terminals 101 and 102. Specifically, the input end of transmission filter circuit 63T is connected to the output end of power amplifier circuit 25, whereas the output end of transmission filter circuit 63T is connected to antenna connection terminals 101 and 102 via switch circuit 51C.

Reception filter circuit 63R (B-Rx) has a passband that includes a downlink operation band in Band B. Accordingly, reception filter circuit 63R can pass reception signals in Band B. Reception filter circuit 63R is connected between antenna connection terminals 101 and 102 and low-noise amplifier circuit 26. Specifically, the input end of reception filter circuit 63R is connected to antenna connection terminals 101 and 102 via switch circuit 51C, whereas the output end of reception filter circuit 63R is connected to the input end of low-noise amplifier circuit 26.

Radio frequency circuit 1C is separated and mounted on two modules, namely first radio frequency module 1AC and second radio frequency module 1B. Specifically, switch circuits 51C and 52, first radio frequency circuit 11, and third radio frequency circuit 13 are mounted in first radio frequency module 1AC, and second radio frequency circuit 12 is mounted in second radio frequency module 1B.

[2.2 Advantageous Effects and Others]

As described above, a radio frequency circuit 1C according to the exemplary embodiment includes a third radio frequency circuit 13. The third radio frequency circuit 13 includes a power amplifier circuit 25, and a transmission filter circuit 63T connected to power amplifier circuit 25. The transmission filter circuit 63T has a passband that includes Band B, and a switch circuit 51C that includes terminal 514 connected to a third radio frequency circuit 13.

According to this, the radio frequency circuit 1C can handle transmission of signals in Band B in addition to Band A.

For example, in the radio frequency circuit 1C according to the exemplary embodiment, Band A may be n41 for 5th Generation New Radio (5G NR), and Band B may be one of Band 2 for Long Term Evolution (LTE), Band 66 for LTE, Band 12 for LTE, or Band 25 for LTE.

According to this, in n41 for 5G NR for which adoption of Power Class 1.5 is being examined, deterioration of quality of signals and power efficiency can be reduced. Furthermore, any of Band 2, Band 66, Band 12, and Band 25 for LTE that allow simultaneous transmission with n41 for 5G NR can also be supported.

Variation 1

Next, Variation 1 of Embodiments 1 and 2 is to be described. Radio frequency circuits 1 and 1C according to this variation are different from the radio frequency circuits according to Embodiments 1 and 2 described above mainly in that a differential-amplifier type power amplifier circuit 22A is included instead of power amplifier circuit 22. In the following, a circuit configuration of power amplifier circuit 22A according to this variation is to be specifically described with reference to FIG. 7.

Figure 7:
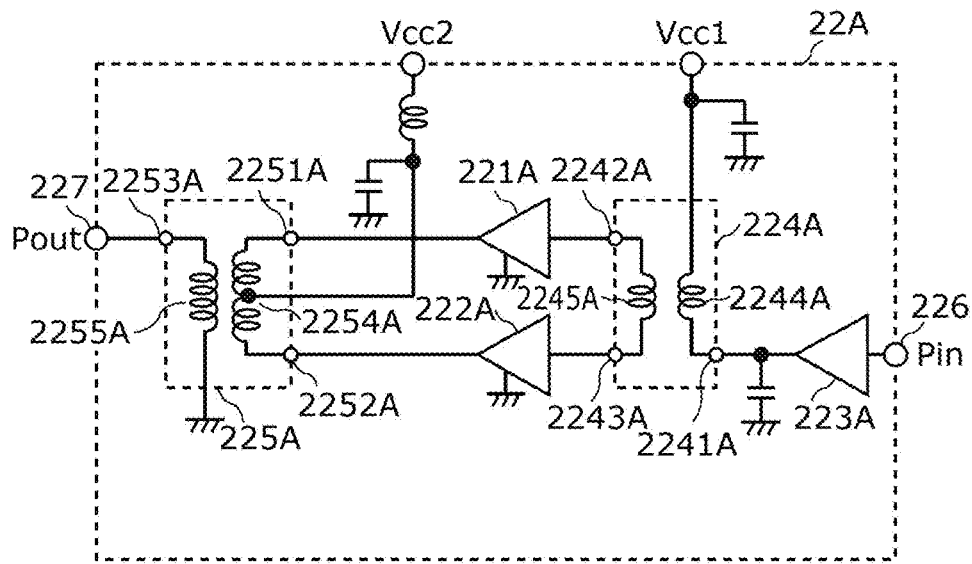
FIG. 7 illustrates a circuit configuration of a power amplifier circuit according to Variation 1.

FIG. 7 illustrates a circuit configuration of power amplifier circuit 22A according to Variation 1. Power amplifier circuit 22A includes power amplifiers 221A to 223A, divider 224A, combiner 225A, input terminal 226 connected to terminal 523 of switch circuit 52, and output terminal 227 connected to the input end of transmission filter circuit 62T.

Divider 224A is a first transformer, and can divide one signal into two antiphase signals. Thus, divider 224A can transform a single-ended signal into differential signals. Divider 224A includes input terminal 2241A, output terminals 2242A and 2243A, coil 2244A, and coil 2245A.

Input terminal 2241A is an example of a first input terminal, and is connected to the output end of power amplifier 223A. Output terminal 2242A is an example of a first output terminal, and is connected to the input end of power amplifier 221A. Output terminal 2243A is an example of a second output terminal, and is connected to the input end of power amplifier 222A.

Coil 2244A is an example of a first coil, and is a primary coil of the first transformer. An end of coil 2244A is connected to input terminal 2241A. The other end of coil 2244A is connected to a first power supply (power supply voltage Vcc1). Coil 2245A is an example of a second coil, and is a secondary coil of the first transformer. An end of coil 2245A is connected to output terminal 2242A. The other end of coil 2245A is connected to output terminal 2243A.

Combiner 225A is a second transformer, and can combine two antiphase signals into one signal. Thus, combiner 225A can transform differential signals into a single-ended signal. Combiner 225A includes input terminals 2251A and 2252A, output terminal 2253A, coil 2254A, and coil 2255A.

Input terminal 2251A is an example of a second input terminal, and is connected to the output end of power amplifier 221A. Input terminal 2252A is an example of a third input terminal, and is connected to the output end of power amplifier 222A. Output terminal 2253A is an example of a third output terminal, and is connected to output terminal 227 of power amplifier circuit 22A.

Coil 2254A is an example of a third coil, and is a primary coil of the second transformer. An end of coil 2254A is connected to input terminal 2251A. The other end of coil 2254A is connected to input terminal 2252A. A middle point of coil 2254A is connected to a second power supply (power supply voltage Vcc2).

Coil 2255A is an example of a fourth coil, and is a secondary coil of the second transformer. An end of coil 2255A is connected to output terminal 2253A. The other end of coil 2255A is connected to the ground.

Power amplifier 221A is an example of a first power amplifier, and can amplify one of signals resulting from being divided by divider 224A. The input end of power amplifier 221A is connected to output terminal 2242A of divider 224A. The output end of power amplifier 221A is connected to input terminal 2251A of combiner 225A.

Power amplifier 222A is an example of a second power amplifier, and can amplify the other of the signals resulting from being divided by divider 224A. The input end of power amplifier 222A is connected to output terminal 2243A of divider 224A. The output end of power amplifier 222A is connected to input terminal 2252A of combiner 225A.

Power amplifier 223A can amplify transmission signals in Band A received through input terminal 226. The input end of power amplifier 223A is connected to input terminal 226, and the output end of power amplifier 223A is connected to input terminal 2241A of divider 224A.

Note that the circuit configuration of power amplifier circuit 22A illustrated in FIG. 7 is an example of a circuit configuration of a differential-amplifier type amplifier circuit, but the configuration is not limited to the illustrated one. For example, one or more or all of inductors and capacitors shown in FIG. 7 may not be included in power amplifier circuit 22A. Power amplifier 223A may not be included in power amplifier circuit 22A.

As described above, a power amplifier circuit 22A according to this variation includes power amplifiers 221A and 222A, a divider 224A, and a combiner 225A. The divider 224A includes an input terminal 2241A, an output terminal 2242A connected to an input end of power amplifier 221A, and an output terminal 2243A connected to an input end of power amplifier 222A. The combiner 225A includes an input terminal 2251A connected to an output end of power amplifier 221A, an input terminal 2252A connected to an output end of power amplifier 222A, and an output terminal 2253A.

According to this, transmission signals in Band A resulting from being divided by divider 224A can be separately amplified by two power amplifiers 221A and 222A. Thus, power amplifier circuit 22A can distribute a load onto two power amplifiers 221A and 222A, and higher output power can be achieved.

For example, in the power amplifier circuit 22A according to this variation, the divider 224A is a first transformer that includes coil 2244A and coil 2245A. One end of coil 2244A is connected to the input terminal 2241A, one end of coil 2245A is connected to the output terminal 2242A, and another end of coil 2245A is connected to the output terminal 2243A. The combiner 225A is a second transformer that includes coil 2254A and coil 2255A. One end of coil 2254A is connected to the input terminal 2251A, another end of coil 2254A is connected to the input terminal 2252A, one end of coil 2255A is connected to the output terminal 2253A, and another end of coil 2255A is connected to ground.

According to this, a transformer is used as divider 224A and combiner 225A, and thus power amplifiers 221A and 222A operate in antiphase. At this time, fundamental currents at power amplifiers 221A and 222A are in antiphase and thus flow in opposite directions, so that the fundamental currents do not readily flow through ground lines and power lines disposed at a substantially equal distance from power amplifiers 221A and 222A. Accordingly, unnecessary currents can be prevented from flowing into the ground lines and the power lines, and thus a decrease in power gain seen in a conventional power amplifier can be reduced. Further, differential signals amplified by power amplifiers 221A and 222A are combined, and thus noise components similarly superimposed on the differential signals can be cancelled out, and even-ordered harmonic components can be reduced.

Variation 2

Next, Variation 2 of Embodiments 1 and 2 is to be described. Radio frequency circuits 1 and 1C according to this variation are different from the radio frequency circuits according to Embodiments 1 and 2 described above mainly in that a Wilkinson type power amplifier circuit 22B is included instead of power amplifier circuit 22. In the following, a circuit configuration of power amplifier circuit 22B according to this variation is to be described with reference to FIG. 8.

Figure 8:
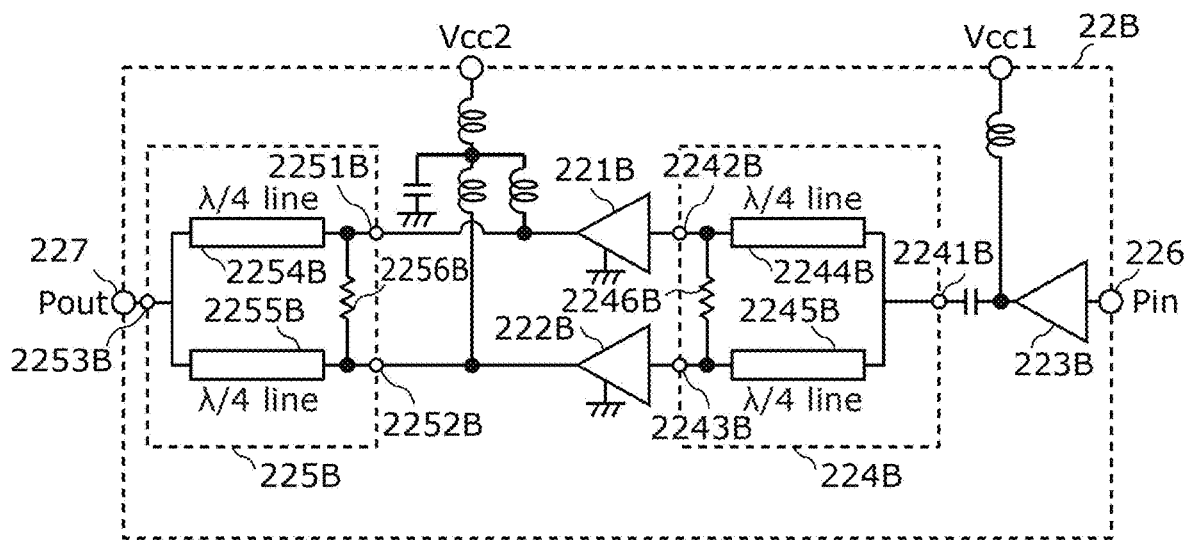
FIG. 8 illustrates a circuit configuration of a power amplifier circuit according to Variation 2.

FIG. 8 illustrates a circuit configuration of power amplifier circuit 22B according to Variation 2. Power amplifier circuit 22B includes power amplifiers 221B to 223B, divider 224B, combiner 225B, input terminal 226, and output terminal 227.

Divider 224B is a Wilkinson divider, and can divide one signal into two in-phase signals. Divider 224B includes input terminal 2241B, output terminals 2242B and 2243B, ¼ wavelength lines (λ/4 lines) 2244B and 2245B, and resistor 2246B.

Input terminal 2241B is an example of a first input terminal, and is connected to the output end of power amplifier 223B and a first power supply (power supply voltage Vcc1). Output terminal 2242B is an example of a first output terminal, and is connected to the input end of power amplifier 221B. Output terminal 2243B is an example of a second output terminal, and is connected to the input end of power amplifier 222B.

The input end of ¼ wavelength line 2244B is connected to input terminal 2241B. The output end of ¼ wavelength line 2244B is connected to output terminal 2242B.

The input end of ¼ wavelength line 2245B is connected to input terminal 2241B. The output end of ¼ wavelength line 2245B is connected to output terminal 2243B.

Resistor 2246B is connected in series between the output end of ¼ wavelength line 2244B and the output end of ¼ wavelength line 2245B.

Combiner 225B is a Wilkinson combiner, and can combine two in-phase signals into one signal. Combiner 225B includes input terminals 2251B and 2252B, output terminals 2253B, ¼ wavelength lines 2254B and 2255B, and resistor 2256B.

Input terminal 2251B is an example of a second input terminal, and is connected to the output end of power amplifier 221B and a second power supply (power supply voltage Vcc2). Input terminal 2252B is an example of a third input terminal, and is connected to the output end of power amplifier 222B and the second power supply (power supply voltage Vcc2). Output terminal 2253B is an example of a third output terminal, and is connected to output terminal 227 of power amplifier circuit 22B.

The input end of ¼ wavelength line 2254B is connected to input terminal 2251B. The output end of ¼ wavelength line 2254B is connected to output terminal 2253B.

The input end of ¼ wavelength line 2255B is connected to input terminal 2252B. The output end of ¼ wavelength line 2255B is connected to output terminal 2253B.

Resistor 2256B is connected in series between the input end of ¼ wavelength line 2254B and the input end of ¼ wavelength line 2255B.

Power amplifier 221B is an example of a first power amplifier, and can amplify one of signals resulting from being divided by divider 224B. The input end of power amplifier 221B is connected to output terminal 2242B of divider 224B. The output end of power amplifier 221B is connected to input terminal 2251B of combiner 225B.

Power amplifier 222B is an example of a second power amplifier, and can amplify the other of the signals resulting from being divided by divider 224B. The input end of power amplifier 222B is connected to output terminal 2243B of divider 224B. The output end of power amplifier 222B is connected to input terminal 2252B of combiner 225B.

Power amplifier 223B can amplify transmission signals in Band B received through input terminal 226. The input end of power amplifier 223B is connected to input terminal 226, and the output end of power amplifier 223B is connected to input terminal 2241B of divider 224B.

Note that the circuit configuration of power amplifier circuit 22B illustrated in FIG. 8 is an example of a circuit configuration of a Wilkinson type amplifier circuit, but the configuration is not limited to the illustrated one. For example, one or more or all of inductors and capacitors shown in FIG. 8 may not be included in power amplifier circuit 22B. Power amplifier 223B may not be included in power amplifier circuit 22B.

As described above, a power amplifier circuit 22B according to this variation includes power amplifiers 221B and 222B, a divider 224B, and a combiner 225B. The divider 224B includes an input terminal 2241B, an output terminal 2242B connected to an input end of power amplifier 221B, and an output terminal 2243B connected to an input end of power amplifier 222B. The combiner 225B includes an input terminal 2251B connected to an output end of power amplifier 221B, an input terminal 2252B connected to an output end of power amplifier 222B, and an output terminal 2253B.

According to this, transmission signals in Band A resulting from being divided by divider 224B can be separately amplified by two power amplifiers 221B and 222B. Thus, the power amplifier circuit 22B can distribute a load onto two power amplifiers 221B and 222B, and higher output power can be achieved.

For example, in power amplifier circuit 22B according to this variation, divider 224B may be a Wilkinson divider, and combiner 225B may be a Wilkinson combiner.

According to this, a Wilkinson circuit is used as divider 224B and combiner 225B, and thus one signal can be efficiently divided into two in-phase signals, and the two in-phase signals amplified by power amplifiers 221B and 222B can be efficiently combined.

Variation 3

Next, Variation 3 of Embodiments 1 and 2 is to be described. Radio frequency circuits 1 and 1C according to this variation are different from the radio frequency circuits according to Variation 1 described above mainly in that transmission filter circuit 62TC that includes two transmission filters 621TC and 622TC provided between and connected to combiner 225A and power amplifiers 221A and 222A, respectively, is included instead of transmission filter circuit 62T. The following gives description of a circuit configuration of power amplifier circuit 22C and transmission filter circuit 62TC according to this variation, focusing on differences from Variation 1 above, with reference to FIG. 9.

Figure 9:
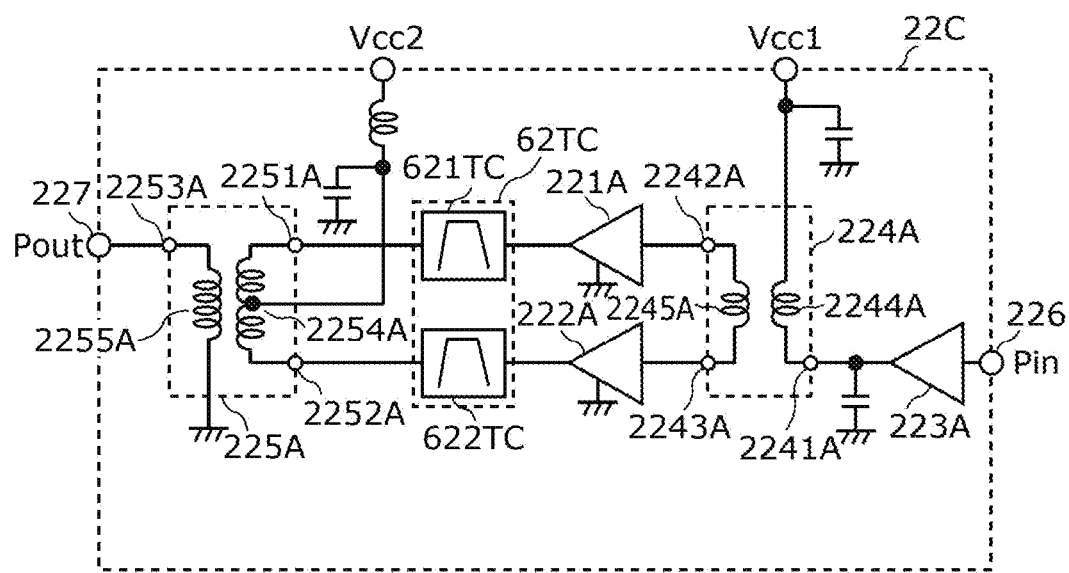
FIG. 9 illustrates a circuit configuration of a power amplifier circuit and a transmission filter circuit according to Variation 3.

FIG. 9 illustrates a circuit configuration of power amplifier circuit 22C and transmission filter circuit 62TC according to Variation 3. Power amplifier circuit 22C includes power amplifiers 221A to 223A, divider 224A, combiner 225A, input terminal 226 connected to terminal 523 of switch circuit 52, output terminal 227 connected to terminal 513 of switch circuit 51/51C, and transmission filter circuit 62TC. Transmission filter circuit 62TC includes transmission filters 621TC and 622TC.

Transmission filter 621TC is an example of a first filter included in a second filter circuit, and has a passband that includes an uplink operation band in Band A. The input end of transmission filter 621TC is connected to the output end of power amplifier 221A. The output end of transmission filter 621TC is connected to input terminal 2251A of combiner 225A.

Transmission filter 622TC is an example of a second filter included in a second filter circuit, and has a passband that includes an uplink operation band in Band A. The input end of transmission filter 622TC is connected to the output end of power amplifier 222A. The output end of transmission filter 622TC is connected to input terminal 2252A of combiner 225A.

As described above, in a power amplifier circuit 22C according to this variation, the transmission filter circuit 62TC includes a transmission filter 621TC that includes one end connected to the output end of power amplifier 221A, and another end connected to input terminal 2251A of combiner 225A; and transmission filter 622TC that includes one end connected to the output end of power amplifier 222A, and an other end connected to input terminal 2252A of combiner 225A.

According to this, two signals resulting from being divided by divider 224A pass through transmission filters 621TC and 622TC. Thus, two transmission filters having lower power durability than power durability required for a transmission filter through which a signal resulting from being combined by combiner 225A passes can be used.

Variation 4

Next, Variation 4 of Embodiments 1 and 2 is to be described. Radio frequency circuits 1 and 1C according to this variation are different from the radio frequency circuits according to Variation 2 described above mainly in that transmission filter circuit 62TD that includes two transmission filter circuit filters 621TD and 622TD provided between and connected to combiner 225B and power amplifiers 221B and 222B, respectively, is included instead of transmission filter circuit 62T. The following gives description of a circuit configuration of power amplifier circuit 22D and transmission filter circuit 62TD according to this variation, focusing on differences from Variation 2 above, with reference to FIG. 10.

Figure 10:
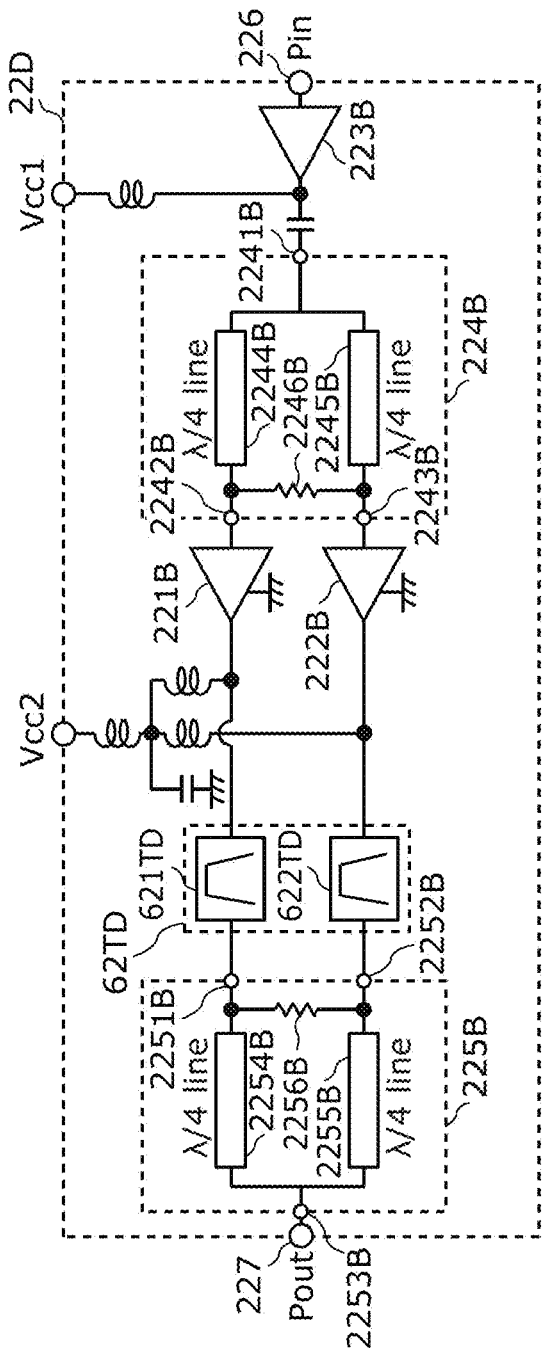
FIG. 10 illustrates a circuit configuration of a power amplifier circuit and a transmission filter circuit according to Variation 4.

FIG. 10 illustrates a circuit configuration of power amplifier circuit 22D and transmission filter circuit 62TD according to Variation 4. Power amplifier circuit 22D includes power amplifiers 221B to 223B, divider 224B, combiner 225B, input terminal 226 connected to terminal 523 of switch circuit 52, output terminal 227 connected to terminal 513 of switch circuit 51/51C, and transmission filter circuit 62TD. Transmission filter circuit 62TD includes transmission filters 621TD and 622TD.

Transmission filter 621TD is an example of a first filter included in a second filter circuit, and has a passband that includes an uplink operation band in Band B. The input end of transmission filter 621TD is connected to the output end of power amplifier 221B. The output end of transmission filter 621TD is connected to input terminal 2251B of combiner 225B.

Transmission filter 622TD is an example of a second filter included in a second filter circuit, and has a passband that includes an uplink operation band in Band B. The input end of transmission filter 622TD is connected to the output end of power amplifier 222B. The output end of transmission filter 622TD is connected to input terminal 2252B of combiner 225B.

As described above, in the power amplifier circuit 22D according to this variation, a transmission filter circuit 62TD includes a transmission filter 621TD that includes one end connected to the output end of power amplifier 221B and another end connected to input terminal 2251B of combiner 225B, and a transmission filter 622TD that includes one end connected to the output end of power amplifier 222B and another end connected to input terminal 2252B of combiner 225B.

According to this, two signals resulting from being divided by divider 224B pass through transmission filters 621TD and 622TD. Thus, two transmission filters having lower power durability than power durability required for a transmission filter through which one signal resulting from being combined by combiner 225B passes can be used.

Other Exemplary Embodiments

The above has described radio frequency circuits and radio frequency modules according to the present disclosure, yet the radio frequency circuits and the radio frequency modules according to the present disclosure are not limited to the above exemplary embodiments. The present disclosure also encompasses exemplary embodiments achieved by combining arbitrary elements in the above exemplary embodiments, variations as a result of applying, to the exemplary embodiments, various modifications that may be conceived by those skilled in the art within a range that does not depart from the scope of the present disclosure, and various devices that each include the radio frequency module described above.

For example, in circuit configurations of the radio frequency circuits and the communication devices according to the above exemplary embodiments, another circuit element and another line, for instance, may be disposed between circuit elements and paths connecting signal paths, which are disclosed in the drawings. For example, an impedance matching circuit may be disposed between transmission filter circuit 61T and power amplifier circuit 21 and/or between transmission filter circuit 62T and power amplifier circuit 22. At this time, the impedance matching circuit may include an inductor and/or a capacitor, for example.

Note that in the above exemplary embodiments, radio frequency circuits 1 and 1C each support a band for FDD, yet the supported band is not limited thereto. For example, radio frequency circuit 1 and/or radio frequency circuit 1C may support a band for time division duplex (TDD), or may support both of the bands for FDD and TDD. In this case, radio frequency circuit 1 and/or radio frequency circuit 1C may each include a filter circuit having a passband that includes a band for TDD, and a switch circuit that switches between transmission and reception of signals.

Note that communication device 5 according to Embodiment 1 described above includes one antenna 2, and communication device 5C according to Embodiment 2 described above includes two antennas 2a and 2b, yet the number of antennas included is not limited thereto. For example, communication device 5 may include two antennas, and communication device 5C may include only one antenna. Further, communication devices 5 and 5C may each include three or more antennas.

Note that in Embodiment 2 above, signals in two bands can be transmitted and received, yet the number of bands is not limited thereto. The radio frequency module may support three or more bands.

Note that in Embodiment 1 above, switch circuit 51 is mounted on module board 91A on which first radio frequency circuit 11 is mounted, but may be mounted on module board 91B on which second radio frequency circuit 12 is mounted, and may include a chemical compound semiconductor. As the chemical compound semiconductor, gallium arsenic (GaAs), aluminum arsenide (AlAs), indium arsenide (InAs), gallium phosphide (GaP), indium antimonide (InSb), gallium nitride (GaN), indium nitride (InN), aluminum nitride (AlN), silicon carbide (SiC), gallium (III) oxide ($Ga_2O_3$), or gallium bismuth (GaBi), for instance, can be used, but the chemical compound is not limited thereto. According to this, when switch circuit 51 is mounted on module board 91B, deterioration of electrical characteristics of switch circuit 51 due to heat can be reduced. Note that also in Embodiment 2, switch circuit 51C may be mounted on module board 91B, similarly.

Note that in the above exemplary embodiments, the first radio frequency module is a module for transmission and reception of signals, but may be a module dedicated to reception of signals. Thus, first radio frequency circuit 11 may include low-noise amplifier circuit 23, and may not include power amplifier circuit 21. Similarly, third radio frequency circuit 13 in Embodiment 2 may not include power amplifier circuit 25. According to this, since switch circuits 51 and 51C are mounted on the module dedicated to reception of signals, deterioration of electrical characteristics of switch circuits 51 and 51C due to heat can be reduced.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to communication devices such as mobile phones, as a radio frequency module disposed in a front end portion.

The invention claimed is:
1. A radio frequency circuit comprising:
a first radio frequency circuit;
a second radio frequency circuit; and
a first switch circuit that includes:
  a first terminal connected to an antenna connection terminal;
  a second terminal connected to the first radio frequency circuit; and
  a third terminal connected to the second radio frequency circuit,
wherein the first radio frequency circuit includes:
  a first power amplifier circuit configured to support a first power class, and
  a first filter circuit connected to the first power amplifier circuit, and having a passband that includes a first band; and
the second radio frequency circuit includes:
  a second power amplifier circuit configured to support a second power class having a maximum output power greater than a maximum output power of the first power class, and
  a second filter circuit connected to the second power amplifier circuit, and having a passband that includes the first band.
2. The radio frequency circuit according to claim 1, wherein the second filter circuit has a power durability greater than a power durability of the first filter circuit.
3. The radio frequency circuit according to claim 2, wherein the first filter circuit includes a surface acoustic wave (SAW) filter, and the second filter circuit includes a bulk acoustic wave (BAW) filter or a dielectric resonator filter.

4. The radio frequency circuit according to claim 1, wherein the second power amplifier circuit includes:
a first power amplifier,
a second power amplifier,
a divider, and
a combiner;
the divider includes:
a first input terminal,
a first output terminal connected to an input end of the first power amplifier, and
a second output terminal connected to an input end of the second power amplifier; and
the combiner includes:
a second input terminal connected to an output end of the first power amplifier,
a third input terminal connected to an output end of the second power amplifier, and
a third output terminal.

5. The radio frequency circuit according to claim 4, wherein the second filter circuit includes:
a first filter that includes one end connected to the output end of the first power amplifier, and an other end connected to the second input terminal of the combiner, and
a second filter that includes one end connected to the output end of the second power amplifier, and an other end connected to the third input terminal of the combiner.

6. The radio frequency circuit according to claim 4, wherein the divider is a first transformer that includes a first coil and a second coil,
one end of the first coil is connected to the first input terminal,
one end of the second coil is connected to the first output terminal,
an other end of the second coil is connected to the second output terminal,
the combiner is a second transformer that includes a third coil and a fourth coil,
one end of the third coil is connected to the second input terminal,
an other end of the third coil is connected to the third input terminal,
one end of the fourth coil is connected to the third output terminal, and
an other end of the fourth coil is connected to ground.

7. The radio frequency circuit according to claim 4, wherein the divider is a Wilkinson divider, and
the combiner is a Wilkinson combiner.

8. The radio frequency circuit according to claim 1, wherein the first power amplifier includes a heterojunction bipolar transistor, and
the second power amplifier circuit includes a gallium nitride transistor or a silicon carbide transistor.

9. The radio frequency circuit according to claim 1, wherein the first switch circuit is configured to connect the first terminal to the second terminal under a condition that the first band is used in the first power class, and
the first switch circuit is configured to connect the first terminal to the third terminal under a condition that the first band is used in the second power class.

10. The radio frequency circuit according to claim 1, further comprising:
a second switch circuit that includes:
a fourth terminal connected to an input terminal configured to receive an external transmission signal in the first band,
a fifth terminal connected to the first power amplifier circuit, and
a sixth terminal connected to the second power amplifier circuit.

11. The radio frequency circuit according to claim 10, wherein the second switch circuit is configured to connect the fourth terminal to the fifth terminal under a condition that the first band is used in the first power class, and
the second switch circuit is configured to connect the fourth terminal to the sixth terminal under a condition that the first band is used in the second power class.

12. The radio frequency circuit according to claim 1, wherein the first band is one of Band 41 for Long Term Evolution (LTE), Band 5 for LTE, Band 12 for LTE, n41 for 5th Generation New Radio (5G NR), or n71 for 5G NR.

13. The radio frequency circuit according to claim 1, further comprising:
a third radio frequency circuit, including:
a third power amplifier circuit, and
a third filter circuit connected to the third power amplifier circuit, and having a passband that includes a second band,
wherein the first switch circuit includes a seventh terminal connected to the third radio frequency circuit.

14. The radio frequency circuit according to claim 13, wherein the first band is n41 for 5th Generation New Radio (5G NR), and
the second band is one of Band 2 for Long Term Evolution (LTE), Band 66 for LTE, Band 12 for LTE, or Band 25 for LTE.

15. The radio frequency circuit according to claim 1, wherein the first power class is Power Class 2 or 3, and
the second power class is Power Class 1 or 1.5.

16. The radio frequency circuit according to claim 1, wherein the first radio frequency circuit is mounted on a first module board, and
the second radio frequency circuit is mounted on a second module board.

17. The radio frequency circuit according to claim 16, wherein the first switch circuit is mounted on the first module board.

18. A radio frequency module comprising:
a module board;
a first input terminal disposed on the module board and configured to receive an external transmission signal in a first band;
a power amplifier circuit disposed on the module board and connected to the first input terminal, the power amplifier circuit being configured to support a first power class;
a filter circuit disposed on the module board and connected to the power amplifier circuit;
a second input terminal disposed on the module board and configured to receive an external transmission signal in the first band, the external transmission signal being amplified to have power that satisfies a maximum output power of a second power class that is greater than a maximum output power of the first class; and
a switch circuit disposed on the module board and including:
a first terminal connected to an antenna connection terminal, a second terminal connected to the filter circuit, and
a third terminal connected to the second input terminal.

19. The radio frequency module according to claim 18, wherein the switch circuit is configured to connect the first terminal to the second terminal under a condition that the first band is used in the first power class, and
the switch circuit is configured to connect the first terminal to the third terminal under a condition that the first band is used in the second power class.

20. A radio frequency circuit comprising:
a first radio frequency circuit;
a second radio frequency circuit; and
a switch circuit that includes:
    a first terminal connected to an antenna connection terminal,
    a second terminal connected to the first radio frequency circuit, and
    a third terminal connected to the second radio frequency circuit, wherein the first radio frequency circuit includes:
    a low-noise amplifier circuit configured to support reception of a signal in a first band used in a first power class and a second power class having a maximum output power greater than a maximum output power of the first power class, and
    a first filter circuit connected to the low-noise amplifier circuit, and having a passband that includes the first band;
the second radio frequency circuit includes:
    a power amplifier circuit configured to support the second power class, and
    a second filter circuit connected to the power amplifier circuit, and having a passband that includes the first band;
the first radio frequency circuit and the switch circuit are mounted on a first module board; and
the second radio frequency circuit is mounted on a second module board.

* * * * *